(12) United States Patent
Hulse

(10) Patent No.: US 8,109,656 B1
(45) Date of Patent: Feb. 7, 2012

(54) BULB FOR LIGHT-EMITTING DIODE WITH MODIFIED INNER CAVITY

(75) Inventor: George R. Hulse, Arlington Heights, IL (US)

(73) Assignee: Ilight Technologies, Inc., Chicago, IL (US)

( * ) Notice: Subject to any disclaimer, the term of this patent is extended or adjusted under 35 U.S.C. 154(b) by 372 days.

(21) Appl. No.: 12/025,293

(22) Filed: Feb. 4, 2008

Related U.S. Application Data

(63) Continuation-in-part of application No. 11/945,691, filed on Nov. 27, 2007.

(60) Provisional application No. 60/951,500, filed on Jul. 24, 2007, provisional application No. 60/884,638, filed on Jan. 12, 2007.

(51) Int. Cl.
*F21V 9/00* (2006.01)

(52) U.S. Cl. .............. 362/293; 362/311.01; 362/311.02; 362/311.03; 362/311.04

(58) Field of Classification Search .................. 362/293; 362/311.01–311.04
See application file for complete search history.

(56) References Cited

U.S. PATENT DOCUMENTS

| | | | |
|---|---|---|---|
| 4,667,481 A | 5/1987 | Watanabe et al. | |
| 5,642,933 A | 7/1997 | Hitora | |
| 5,769,532 A | 6/1998 | Sasaki | |
| 5,786,665 A | 7/1998 | Ohtsuki et al. | |
| 5,803,579 A | 9/1998 | Turnbull et al. | |
| 6,102,559 A | 8/2000 | Nold et al. | |
| 6,132,072 A | 10/2000 | Turnbull et al. | |
| 6,132,345 A | 10/2000 | Beierschmitt et al. | |
| 6,155,699 A | 12/2000 | Miller et al. | |
| 6,227,679 B1 | 5/2001 | Zhang et al. | |
| 6,244,727 B1 | 6/2001 | Ryan, Jr. et al. | |
| 6,305,813 B1 | 10/2001 | Lekson et al. | |
| 6,335,548 B1 * | 1/2002 | Roberts et al. | 372/23 |
| 6,371,637 B1 | 4/2002 | Atchinson et al. | |
| 6,404,131 B1 | 6/2002 | Kawano et al. | |
| 6,409,361 B1 | 6/2002 | Ikeda | |
| 6,415,531 B1 | 7/2002 | Ohtsuki et al. | |
| 6,471,371 B1 | 10/2002 | Kawashima et al. | |
| 6,521,916 B2 | 2/2003 | Roberts et al. | |

(Continued)

FOREIGN PATENT DOCUMENTS

DE 4003539 8/1991

(Continued)

OTHER PUBLICATIONS

ISA/US, Search Report and Written Opinion for International Application No. PCT/US08/50277, mailed Jun. 30, 2008.

*Primary Examiner* — William Carter
(74) *Attorney, Agent, or Firm* — Fitch, Even, Tabin & Flannery

(57) ABSTRACT

A bulb adapted to fit over and around a light-emitting diode emitting a light of a first hue in a predetermined radiation pattern defines an inner cavity for housing the light-emitting diode with a cross-sectional geometry based on the predetermined radiation pattern of the light-emitting diode. The bulb is composed of a light-transmitting material and a light color-converting material, with the light color-converting material converting the light of the first hue into light of a desired hue, which is then viewed over a light-emitting surface of the bulb.

20 Claims, 4 Drawing Sheets

U.S. PATENT DOCUMENTS

| | | |
|---|---|---|
| 6,523,976 B1 | 2/2003 | Turnbull et al. |
| 6,536,914 B2 | 3/2003 | Hoelen et al. |
| 6,550,949 B1 | 4/2003 | Bauer et al. |
| 6,577,073 B2 | 6/2003 | Shimizu et al. |
| 6,592,238 B2 | 7/2003 | Hulse et al. |
| 6,609,804 B2 | 8/2003 | Nolan et al. |
| 6,641,284 B2 | 11/2003 | Stopa et al. |
| 6,657,382 B2 | 12/2003 | Nagai et al. |
| 6,709,132 B2 | 3/2004 | Ishibashi |
| 6,762,562 B2 | 7/2004 | Leong |
| 6,800,996 B2 | 10/2004 | Nagai et al. |
| 6,834,979 B1 | 12/2004 | Cleaver et al. |
| 6,953,262 B2 | 10/2005 | Hulse et al. |
| 7,005,679 B2 | 2/2006 | Tarsa et al. |
| 7,008,079 B2 | 3/2006 | Smith |
| 7,011,421 B2 | 3/2006 | Hulse et al. |
| 7,021,797 B2 | 4/2006 | Minano et al. |
| 7,036,956 B1 | 5/2006 | Chou |
| 7,086,756 B2 | 8/2006 | Maxik |
| 7,134,770 B2 | 11/2006 | Barlian et al. |
| 7,157,839 B2 | 1/2007 | Ouderkirk et al. |
| 7,158,020 B2 | 1/2007 | Grady, Jr. |
| 7,168,823 B1 | 1/2007 | Jones |
| 7,187,011 B2 | 3/2007 | Tasch et al. |
| 7,188,970 B2 | 3/2007 | Hulse et al. |
| 7,205,719 B2 | 4/2007 | Tain et al. |
| 7,206,507 B2 | 4/2007 | Lee et al. |
| 7,264,366 B2 | 9/2007 | Hulse |
| 7,264,367 B2 | 9/2007 | Hulse |
| 2001/0033488 A1 | 10/2001 | Chliwnyj et al. |
| 2001/0046131 A1 | 11/2001 | Hoelen et al. |
| 2002/0003700 A1 | 1/2002 | Selkee |
| 2002/0030992 A1 | 3/2002 | Lefebvre et al. |
| 2003/0002272 A1 | 1/2003 | Suchiro et al. |
| 2003/0174504 A1 | 9/2003 | Tamaoki |
| 2003/0198049 A1 | 10/2003 | Hulse et al. |
| 2003/0210552 A1 | 11/2003 | Barlian et al. |
| 2004/0027834 A1 | 2/2004 | Chigusa et al. |
| 2004/0057234 A1 | 3/2004 | Mohacsi |
| 2004/0080938 A1 | 4/2004 | Holman et al. |
| 2004/0145895 A1 | 7/2004 | Ouderkirk et al. |
| 2004/0150991 A1 | 8/2004 | Ouderkirk et al. |
| 2004/0196643 A1 | 10/2004 | Terada et al. |
| 2004/0207341 A1 | 10/2004 | Callahan |
| 2005/0052871 A1 | 3/2005 | Leu et al. |
| 2005/0057917 A1 | 3/2005 | Yatsuda |
| 2005/0168987 A1 | 8/2005 | Tamaoki et al. |
| 2005/0195603 A1 | 9/2005 | Hulse |
| 2005/0243550 A1 | 11/2005 | Stekelenberg |
| 2006/0028837 A1 | 2/2006 | Mrakovich |
| 2006/0039143 A1 | 2/2006 | Katoh et al. |
| 2006/0082999 A1 | 4/2006 | Klein |
| 2006/0138440 A1 | 6/2006 | Jyo |
| 2006/0152139 A1 | 7/2006 | Hsieh et al. |
| 2006/0193121 A1 | 8/2006 | Kamoshita |
| 2006/0198119 A1 | 9/2006 | Hulse et al. |
| 2006/0221594 A1 | 10/2006 | Thuot Rann et al. |
| 2006/0262539 A1 | 11/2006 | Goulet et al. |
| 2006/0289884 A1 | 12/2006 | Soules et al. |
| 2007/0023763 A1 | 2/2007 | Takigawa et al. |
| 2007/0024191 A1 | 2/2007 | Chen et al. |
| 2007/0047227 A1 | 3/2007 | Ducharme |
| 2007/0120135 A1 | 5/2007 | Soules et al. |
| 2007/0215890 A1 | 9/2007 | Harbers et al. |
| 2007/0267976 A1 | 11/2007 | Bohler et al. |
| 2008/0246044 A1 | 10/2008 | Pang |
| 2009/0133636 A1 * | 5/2009 | Richmond .................... 362/183 |

FOREIGN PATENT DOCUMENTS

| | | |
|---|---|---|
| EP | 0982532 | 3/2000 |
| EP | 1748498 | 1/2007 |
| JP | 2005197717 | 1/2007 |
| JP | 2007005091 | 1/2007 |
| JP | 2007005372 | 1/2007 |
| JP | 2007005522 | 1/2007 |
| JP | 2007005549 | 1/2007 |
| JP | 2007018815 | 1/2007 |
| JP | 2007035802 | 2/2007 |
| JP | 2007103160 | 4/2007 |
| WO | 0131255 | 5/2001 |
| WO | 0208799 | 1/2002 |
| WO | 2006121625 | 11/2006 |
| WO | 2007075393 | 7/2007 |
| WO | 2007049187 | 11/2007 |

* cited by examiner

BULB FOR LIGHT-EMITTING DIODE WITH MODIFIED INNER CAVITY

CROSS-REFERENCE TO RELATED APPLICATIONS

The present application claims priority to U.S. Provisional Patent Application Ser. No. 60/951,500 filed on Jul. 24, 2007, and is also a continuation-in-part of U.S. patent application Ser. No. 11/945,691 filed on Nov. 27, 2007, which itself claims priority to U.S. Provisional Patent Application Ser. No. 60/884,638 filed on Jan. 12, 2007. The entire disclosures of each of these prior applications are incorporated herein by reference.

BACKGROUND OF THE INVENTION

The present invention is a bulb that fits over and around an LED emitting light of a first hue in a predetermined radiation pattern, converting the light emitted from the LED into light of a desired hue, with a substantially consistent and uniform hue then being observed over the light-emitting surface of the bulb.

Light-emitting diodes (LEDs) are now commonly used for a wide variety of general illumination and special effects illumination. For example, commonly assigned U.S. Pat. Nos. 6,592,238; 6,953,262; and 7,188,970, which are incorporated in their entirety herein by this reference, each describe an illumination device for simulating neon lighting having a plurality of spaced LEDs positioned adjacent the light-receiving surface of a rod-like member or waveguide. The rod-like member/waveguide is made of a material that preferentially scatters light entering the light-receiving surface such that the light intensity pattern exiting a light-emitting surface of the rod-like member/waveguide is substantially uniform.

Nevertheless, the available visible color spectrum for illumination devices that use LEDs is limited by the finite availability of LED colors. Therefore, in commonly assigned U.S. Pat. Nos. 7,011,421; 7,264,366; and 7,264,367, each of which is also incorporated herein by this reference, illumination devices are described that use LEDs in conjunction with fluorescent and/or phosphorescent dyes, allowing for the emission of light in hues that cannot ordinarily be achieved through the use of LEDs alone.

SUMMARY OF THE INVENTION

The present invention is a bulb that fits over and around an LED emitting light of a first hue in a predetermined radiation pattern, converting the light emitted from the LED into light of a desired hue, with a substantially consistent and uniform hue then being observed over the light-emitting surface of the bulb.

An exemplary bulb made in accordance with the present invention is composed of a light-transmitting material (such as a substantially translucent acrylic compound, polyurethane, or similar material) and a light color-converting material. The exemplary bulb has a generally spherical shape and a substantially circular external cross-sectional geometry. The exemplary bulb further defines an inner cavity that fits over and around an LED that emits light in a predetermined radiation pattern, the inner cavity having a cross-sectional geometry based on that predetermined radiation pattern. One suitable light-transmitting material is a translucent acrylic resin that scatters light as it passes through the material. The light color-converting material is some predetermined combination of one or more fluorescent dyes, phosphorescent dyes, and/or other dyes or colorants that are mixed into the light-transmitting material.

When the exemplary bulb is fit over and around an LED that emits light in a predetermined radiation pattern, the LED emits light of a first hue into a light-receiving surface defined by the inner cavity. The light color-converting material in the exemplary bulb converts the light of the first hue into light of a desired hue, which is then observed over the light-emitting surface of the bulb. In order to ensure that the observed light has a substantially consistent and generally uniform hue over the light-emitting surface of the exemplary bulb, the geometry of the bulb is important. Specifically, Applicant has determined that the geometry of the bulb should be keyed to the radiation pattern of the LED to which it will be fit. Therefore, in order to have a bulb with the light-emitting surface of a fixed geometric shape, such as a spherical bulb, the cross-sectional geometry of the light-receiving surface defined by the inner cavity must be modified based on the radiation pattern of the LED.

To construct an exemplary bulb keyed to the predetermined radiation pattern of the LED, the radiation pattern is transposed onto an x-y coordinate system. The bulb, with its generally spherical shape and circular cross-section is superimposed onto the same x-y coordinate system within the boundaries of the transposed radiation pattern. The inner cavity is initially assumed to have a generally circular cross-section, which defines a boundary and is larger than the LED that is to be received in the inner cavity. The radial distance between the transposed radiation pattern and the bulb, i.e., the distance the radiation pattern extends past the light-emitting surface of the bulb 10 at a given angle, is then measured at selected angles. The measured distance is then "added" to the inner cavity, extending the boundary of the inner cavity at the given angle. Thus, an appropriate cross-sectional geometry for the inner cavity can be plotted that is based on the predetermined radiation pattern of the LED. Once this cross-sectional geometry has been so plotted, it is effectively rotated about the y-axis to define the shape of the three-dimensional inner cavity that is to be fit over and around the LED. The result is a generally spherical bulb that fits over and around the LED, with an inner cavity having a cross-sectional geometry based on that predetermined radiation pattern so that a substantially consistent and uniform hue of light is observed over the light-emitting surface of the bulb.

DETAILED DESCRIPTION OF THE INVENTION

The present invention is a bulb that fits over and around an LED emitting light of a first hue in a predetermined radiation pattern, converting the light emitted from the LED into light of a desired hue, with a substantially consistent and uniform hue then being observed over the light-emitting surface of the bulb.

For purposes of the discussion that follows, it is important to recognize that most perceived "colors" are not representative of light of a single wavelength, but rather some combination of wavelengths. In this regard, the dominant or perceived color of light comprised of some combination of wavelengths is generally referred to as hue. In order to provide a mechanism to represent and identify all possible perceived colors, the Commission Internationale l'Eclairage (CIE) constructed the CIE Chromaticity Diagram, which is based on three ideal primary light colors of red, green, and blue. The CIE Chromaticity Diagram is a well-known tool for identifying colors and is well understood by one of ordinary skill in the art. Specifically, since the x-axis of this CIE Chromaticity Diagram represents the amount of ideal red that would be mixed with ideal blue, and the y-axis of the CIE Chromaticity Diagram represents the amount of ideal green that would be mixed with ideal blue, a desired color can be identified in terms of its x and y coordinates. It is also important to recognize that the chromaticity curve, which is representative of the visible spectrum, is commonly superimposed over the diagram such that wavelengths within the visible spectrum are represented along this curve.

Furthermore, the CIE Chromaticity Diagram is also helpful in understanding mixtures of primary light colors. Specifically, if a straight line is drawn between two points on the chromaticity curve, for example from green with a wavelength of 510 nm to red with a wavelength of 700 nm, that straight line illustrates the range of colors that could be created and perceived by the human eye, depending on the relative amounts of primary light colors in the mixture, including various yellowish-green colors and oranges. It is also important to recognize that the central region of the CIE Chromaticity Diagram is representative of white, a combination of the three ideal primary light colors. If any straight line between two colors on the chromaticity curve passes through this central region, those two colors can be mixed to create a perceived white color.

Figure 1:
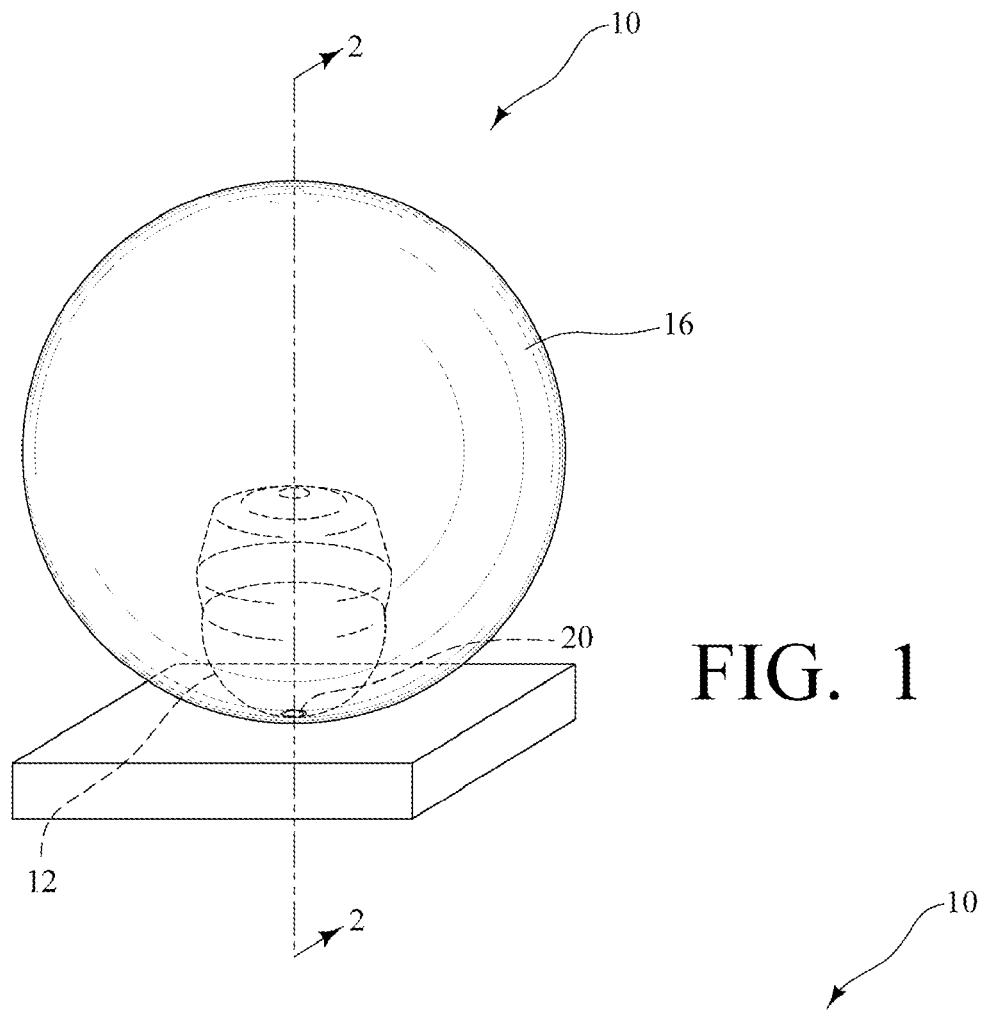
FIG. 1 is a perspective view of an exemplary bulb made in accordance with the present invention.
Figure 2:
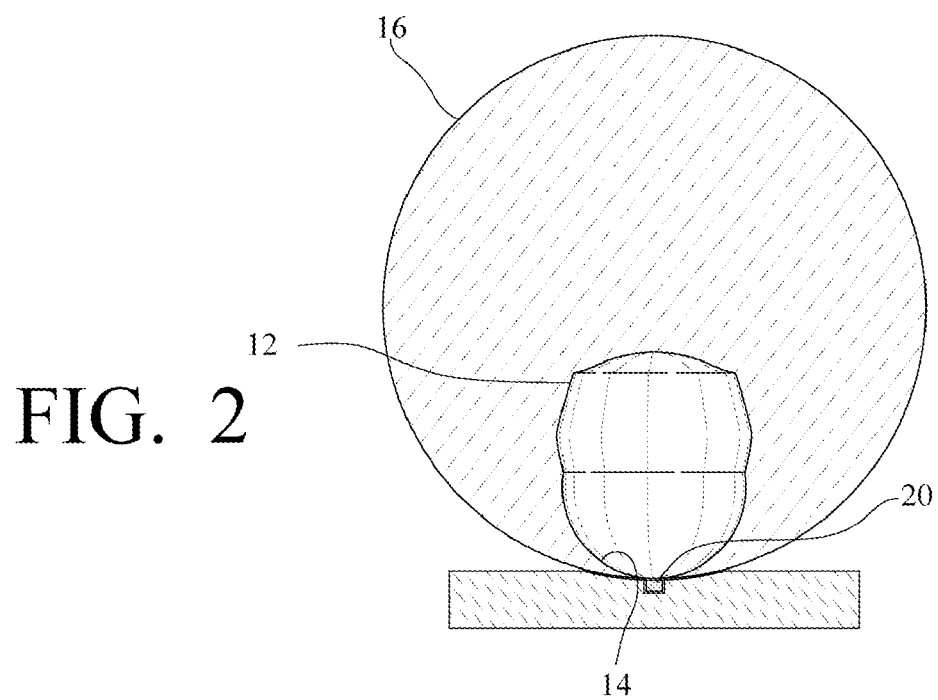
FIG. 2 is a sectional view of the exemplary bulb of FIG. 1, taken along line 2-2 of FIG. 1.
Figure 5:
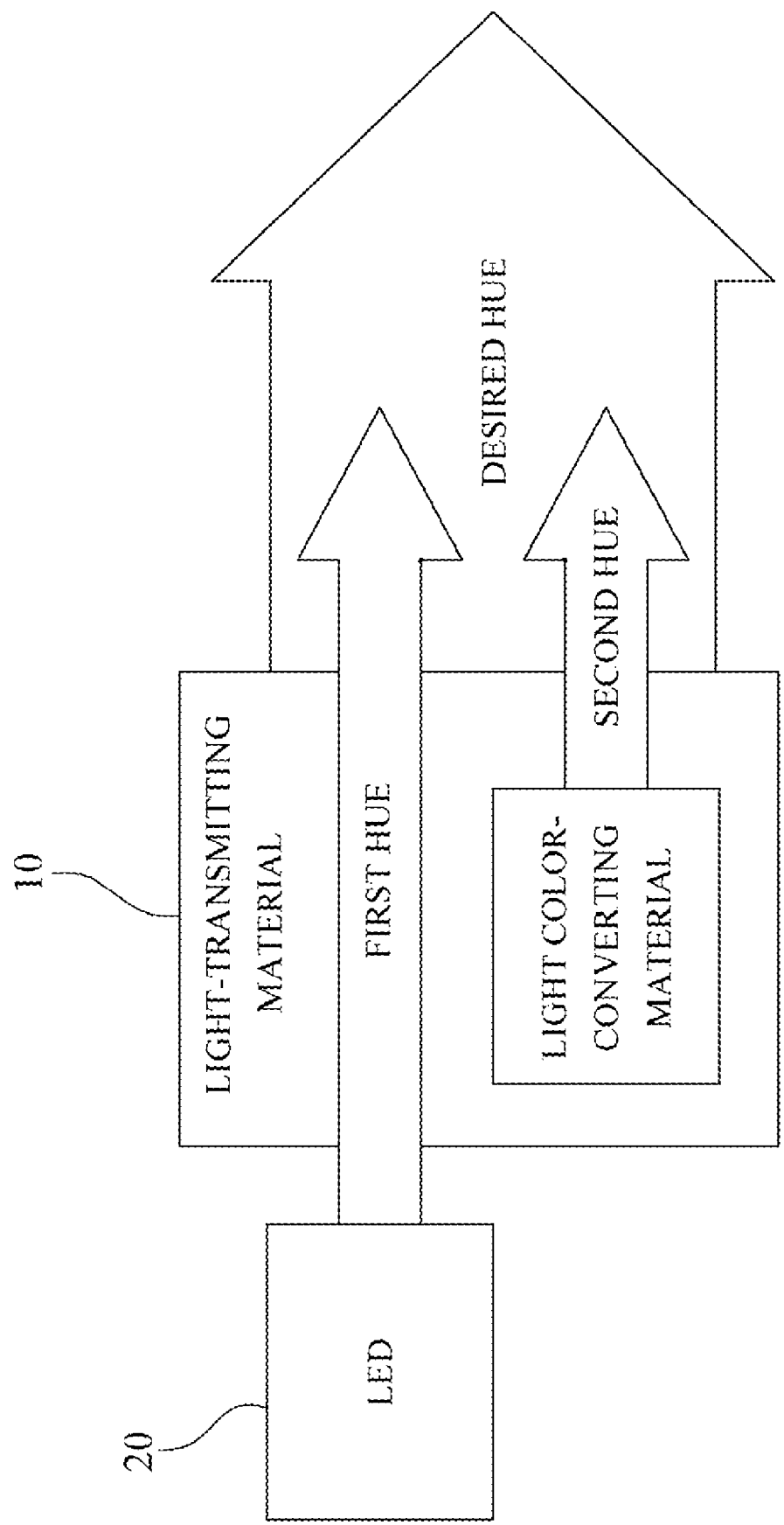
FIG. 5 is a block diagram illustrating the passage of light through the exemplary bulb of FIGS. 1 and 2.

Returning to the present invention, and referring to FIGS. 1, 2 and 5, an exemplary bulb 10 made in accordance with the present invention is composed of a light-transmitting material (such as a substantially translucent acrylic compound, polyurethane, or similar material) and a light color-converting material. This exemplary bulb 10 has a generally spherical shape and a substantially circular external cross-sectional geometry. The exemplary bulb further defines an inner cavity 12 that fits over and around an LED 20 that emits light in a predetermined radiation pattern. For example, the LED 20 may emit light in a generally Lambertian radiation pattern, as further described below with reference to FIGS. 6 and 7. The exemplary bulb 10 further includes a light-receiving surface 14 defined by and within the inner cavity 12, along with a light-emitting surface 16.

Applicant has discovered that one suitable light-transmitting material is a translucent acrylic resin, for example, Plexiglas® Frosted DR-66080 White TL, manufactured and distributed by Arkema, Inc. of Puteaux, France and Philadelphia, Pa. (Plexiglas® is a registered trademark of Arkema, Inc.). This particular material has an inherent haze value (i.e., a measure of the scattering of light as it passes through the material) of approximately 98% according to American Society for Testing Materials (ASTM) Test Method D1003. Of course, similar materials having such scattering properties may also be suitable for the light-transmitting material.

When using such an acrylic resin, the light color-converting material may be some predetermined combination of one or more fluorescent dyes, phosphorescent dyes, and/or other dyes or colorants that are mixed into the light-transmitting material. For example, suitable fluorescent dyes include Lumogen™ F240 (orange), Lumogen™ F170 (yellow), Lumogen™ F285 (pink), and Lumogen™ F850 (green), each of which may be acquired from BASF Corporation of Mount Olive, N.J. Since these dyes are typically manufactured and distributed in powdered form, the dyes can be mixed with pellets of the acrylic resin in an appropriate ratio. The mixture is then preferably dried for removal of moisture, and the mixture can then be molded into the desired geometry.

In any event, when the exemplary bulb 10 is fit over and around an LED 20 that emits light in a predetermined radiation pattern, the LED 20 emits light of a first hue into the light-receiving surface 14 defined by the inner cavity 12. The light color-converting material in the exemplary bulb 10 converts the light of the first hue into light of a desired hue, which is then observed over the light-emitting surface 16 of the bulb 10. In order to ensure that the observed light has a substantially consistent and generally uniform hue over the light-emitting surface 16 of the exemplary bulb 10, the geometry of the bulb is important. Specifically, Applicant has determined that the geometry of the bulb should be keyed to the radiation pattern of the LED 20 to which it will be fit. Therefore, in order to have a bulb with the light-emitting surface 16 of a fixed geometric shape, such as a spherical bulb, the cross-sectional geometry of the light-receiving surface 14 defined by the inner cavity must be modified based on the predetermined radiation pattern of the LED 20.

Figure 6:
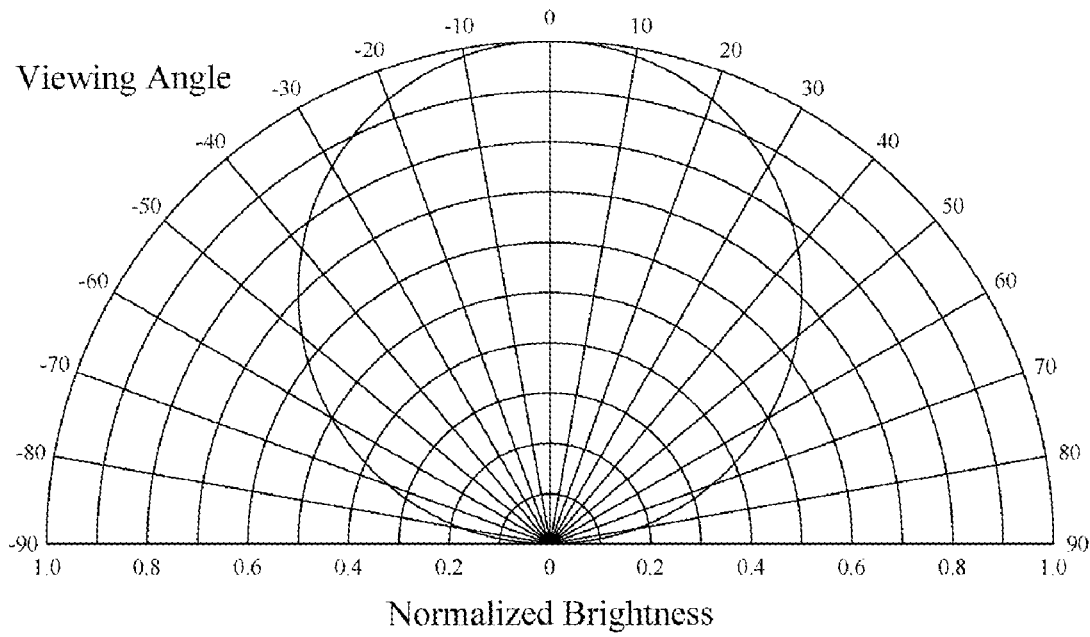
FIG. 6 is a polar plot showing the normalized brightness values depending on the viewing angle for an LED emitting light in a generally Lambertian radiation pattern.
Figure 7:
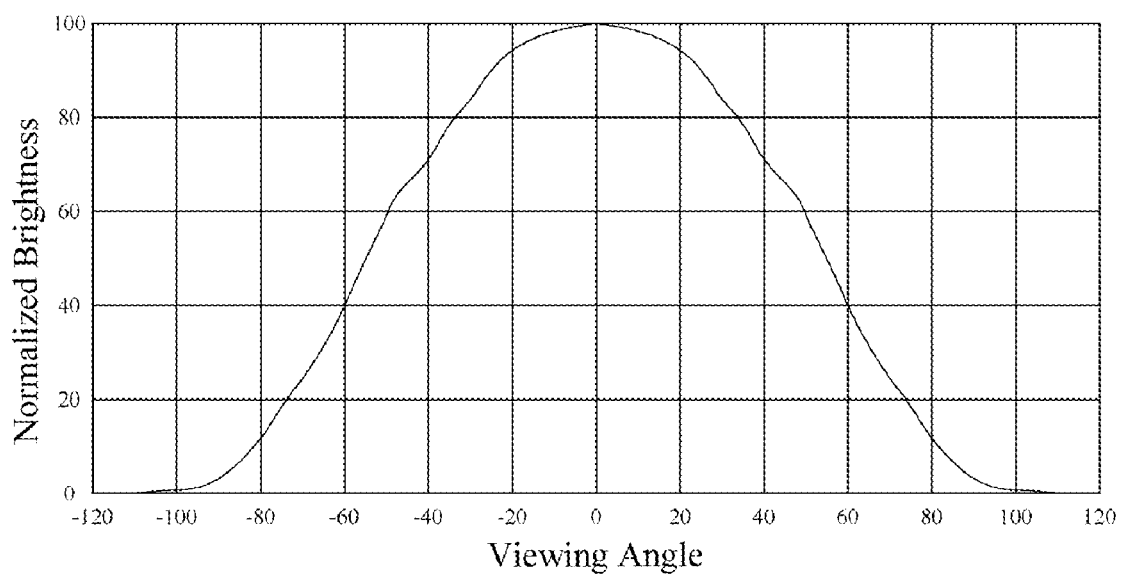
FIG. 7 is a graphical representation of the normalized brightness values depending on the viewing angle similar to FIG. 6, but on a Cartesian coordinate system.

For instance, Applicant has determined that one appropriate LED for use with the bulb 10 of the present invention is a 470-nm (blue) light-emitting diode distributed by Marktech Optoelectronics of Latham, N.Y. under part number LP9K03-B3. This LED emits light in a generally Lambertian radiation pattern, as illustrated in FIGS. 6 and 7. FIG. 6 is a polar plot showing the normalized brightness values depending on the viewing angle, while FIG. 7 is a similar graphical representation on a Cartesian coordinate system. As FIGS. 6 and 7 demonstrate, maximum brightness of the emitted light occurs directly in front of the LED, with the brightness decreasing as an observer moves further away in an angular direction from the front/forward direction of the LED.

Figure 3:
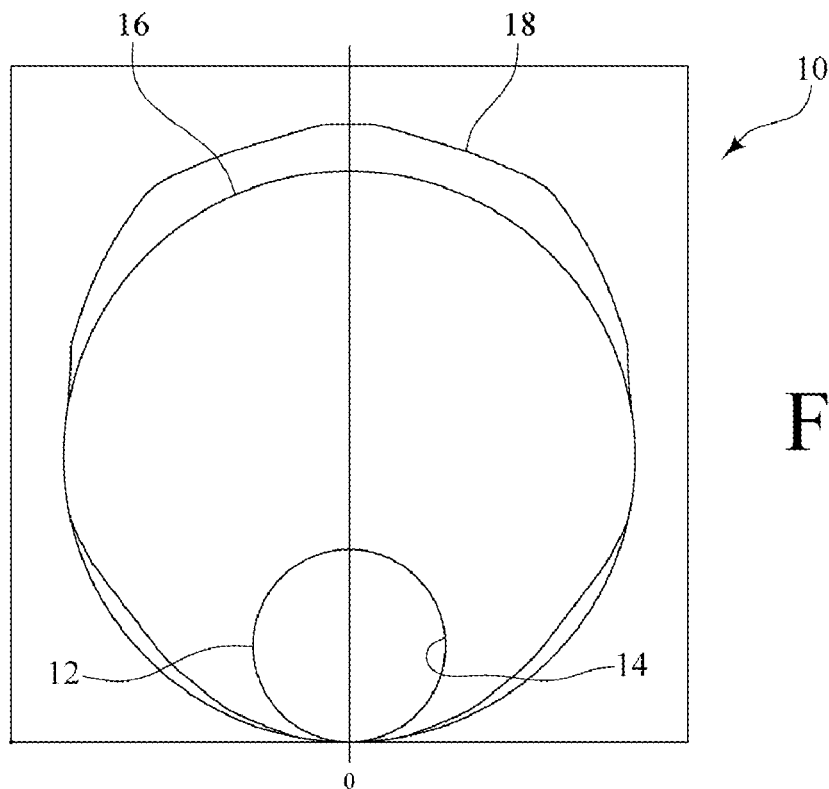
FIG. 3 is a graphical representation of the predetermined radiation pattern of a particular LED as transposed onto an x-y coordinate system, with a bulb having a generally spherical shape and circular cross-section superimposed onto the same x-y coordinate system.
Figure 4:
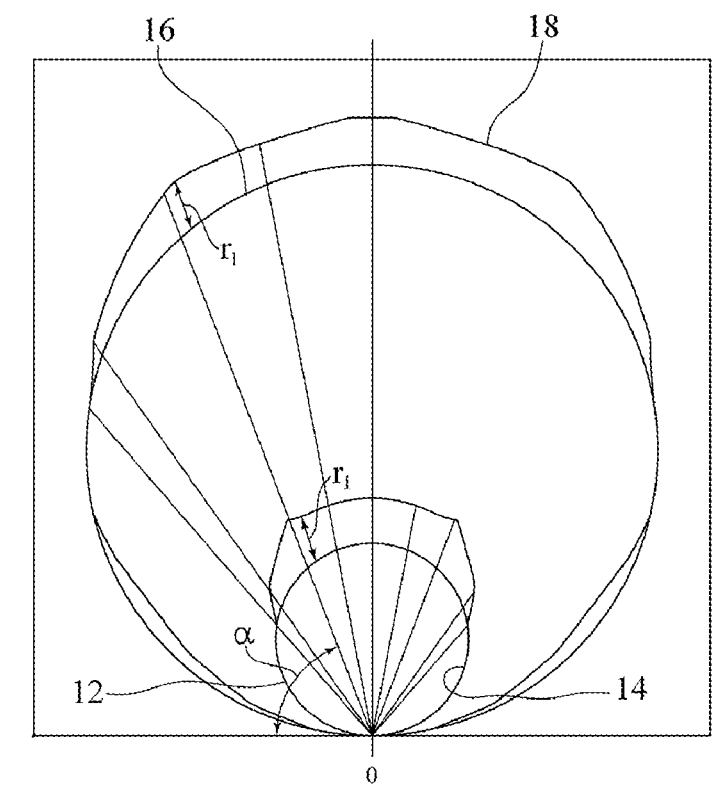
FIG. 4 is a graphical representation similar to FIG. 3, but further illustrating the measuring of radial distances that the predetermined radiation pattern extends past the light-emitting surface of the bulb at selected angles on the x-y coordinate system, and adding those measured radial distances at each selected angle to the generally circular cross-section of the inner cavity.

Accordingly, to construct an exemplary bulb 10 keyed to the predetermined radiation pattern of the LED 20, the predetermined radiation pattern, which in this case is a Lambertian radiation pattern, is transposed onto an x-y coordinate system, as illustrated in FIG. 3 (with reference numeral 18 indicating the transposed radiation pattern). The bulb 10, with its generally spherical shape and circular cross-section is superimposed onto the same x-y coordinate system within the boundaries of the transposed radiation pattern 18. The inner cavity 12 is initially assumed to have a generally circular cross-section, larger than the LED 20 that is to be received in the inner cavity 12, as also illustrated in FIG. 3. The radial distance between the transposed radiation pattern 18 and the bulb 10, i.e., the distance the radiation pattern 18 extends past the light-emitting surface 16 of the bulb 10 at a given angle, is then measured at selected angles. The measured distance is then "added" to the inner cavity 12, extending the boundary of the inner cavity 12 at the given angle. For example, at an angle, α, of approximately 70°, the radial distance, $r_1$, between the transposed radiation pattern 18 and the bulb 10 is added to the inner cavity 12, extending the boundary of the inner cavity 12 accordingly. Thus, an appropriate cross-sectional geometry for the inner cavity 12 can be plotted that is based on the predetermined radiation pattern of the LED 20. Once this cross-sectional geometry has been so plotted, it is effectively rotated about the y-axis to define the shape of the three-dimensional inner cavity 12 that is to be fit over and around the LED 20, resulting the bulb construction illustrated in FIGS. 1 and 2.

Returning to FIGS. 1 and 2, by constructing the bulb 10 in this manner, the amount of light color-converting material that interacts with light emitted from the LED 20 varies according the normalized brightness. At maximum brightness, there is the greatest distance between the LED 20 and the external, light-emitting surface 16 of the bulb 10, and light emitted from the LED 20 along the vertical axis of the bulb (x=0) will thus pass through the greatest amount of the predetermined combination of one or more fluorescent dyes, phosphorescent dyes, and/or other dyes or colorants that are mixed into the light-transmitting material. However, as brightness decreases as an observer moves further away in an angular direction from the front/forward direction of the LED, the amount of light color-converting material through which light emitted from the LED 20 passes has been decreased by the removal of a certain volume of the bulb 10 to create the inner cavity 12. In any event, the result is a generally spherical bulb that fits over and around the LED 20, with a substantially consistent and uniform hue of light observed over the light-emitting surface 16 of the bulb 10.

Finally, with respect to the exemplary bulb 10 discussed above, Applicant has recognized that the surface of the bulb 10 could be roughened, stippled, or otherwise provided with a scattering material to disrupt or prevent a lensing effect at the light-emitting surface 16 as light exits the bulb 10.

One of ordinary skill in the art will also recognize that additional embodiments are possible without departing from the teachings of the present invention or the scope of the claims which follow. This detailed description, and particularly the specific details of the exemplary embodiment disclosed therein, is given primarily for clarity of understanding, and no unnecessary limitations are to be understood therefrom, for modifications will become obvious to those skilled in the art upon reading this disclosure and may be made without departing from the spirit or scope of the claimed invention.

What is claimed is:

1. A bulb adapted to fit over and around a light-emitting diode emitting a light of a first hue in a predetermined radiation pattern, the bulb defining an inner cavity for housing the light-emitting diode having a cross-sectional geometry based on the predetermined radiation pattern of the light-emitting diode, and the bulb being composed of a light-transmitting material and a light color-converting material, said light color-converting material converting the light of the first hue into a light of a desired hue, which is then viewed over a light-emitting surface of the bulb, wherein, as a result of the cross-sectional geometry of the inner cavity defined by the bulb, at a point of maximum brightness in the predetermined radiation pattern of the light-emitting diode, the light of the first hue will pass through a greatest amount of said light color-converting material, while as brightness decreases in the predetermined radiation pattern of the light-emitting diode, the light of the first hue will pass through a lesser amount of said light color-converting material.

2. The bulb as recited in claim 1, wherein the bulb has a generally spherical shape.

3. The bulb as recited in claim 1, wherein the predetermined radiation pattern is a generally Lambertian radiation pattern.

4. The bulb as recited in claim 3, wherein the bulb has a generally spherical shape.

5. The bulb as recited in claim 1, wherein said light color-converting material is one or more fluorescent dyes.

6. The bulb as recited in claim 1, wherein said light color-converting material is one or more phosphorescent dyes.

7. The bulb as recited in claim 1, wherein said light color-converting material is a combination of fluorescent dyes and/or phosphorescent dyes.

8. The bulb as recited in claim 1, wherein said light-transmitting material is an acrylic resin.

9. The bulb as recited in claim 8, wherein said light color-converting material is one or more fluorescent dyes mixed into said acrylic resin.

10. The bulb as recited in claim 1, wherein the cross-sectional geometry for the inner cavity of the bulb is plotted by:
    transposing the predetermined radiation pattern of the light-emitting diode onto an x-y coordinate system;
    superimposing the bulb onto the x-y coordinate system, with the inner cavity of the bulb initially having a generally circular cross-section defining a boundary;
    measuring a radial distance that the predetermined radiation pattern extends past the light-emitting surface of the bulb at selected angles on the x-y coordinate system; and
    adding the measured radial distance at each selected angle to the generally circular cross-section of the inner cavity, extending the boundary of the inner cavity at each selected angle to plot the cross-sectional geometry for the inner cavity.

11. A lighting assembly, comprising
    a light-emitting diode emitting a light of a first hue in a predetermined radiation pattern; and
    a bulb fitting over and around the light-emitting diode, the bulb defining an inner cavity for housing the light-emitting diode having a cross-sectional geometry based on the predetermined radiation pattern of the light-emitting diode, and the bulb being composed of a light-transmitting material and a light color-converting material, said light color-converting material converting the light of the first hue into a light of a desired hue, which is then viewed over a light-emitting surface of the bulb, wherein, as a result of the cross-sectional geometry of the inner cavity defined by the bulb, at a point of maximum brightness in the predetermined radiation pattern of the light-emitting diode, the light of the first hue will pass through a greatest amount of said light color-converting material, while as brightness decreases in the predetermined radiation pattern of the light-emitting diode, the light of the first hue will pass through a lesser amount of said light color-converting material.

12. The lighting assembly as recited in claim 11, wherein the bulb has a generally spherical shape.

13. The lighting assembly as recited in claim 11, wherein the predetermined radiation pattern is a generally Lambertian radiation pattern.

14. The lighting assembly as recited in claim 13, wherein the bulb has a generally spherical shape.

15. The lighting assembly as recited in claim 11, wherein said light color-converting material is one or more fluorescent dyes.

16. The lighting assembly as recited in claim 11, wherein said light color-converting material is one or more phosphorescent dyes.

17. The lighting assembly as recited in claim 11, wherein said light color-converting material is a combination of fluorescent dyes and/or phosphorescent dyes.

18. The lighting assembly as recited in claim 11, wherein said light-transmitting material is an acrylic resin.

19. The lighting assembly as recited in claim 18, wherein said light color-converting material is one or more fluorescent dyes mixed into said acrylic resin.

20. The lighting assembly as recited in claim 11, wherein the cross-sectional geometry for the inner cavity of the bulb is plotted by:
- transposing the predetermined radiation pattern of the light-emitting diode onto an x-y coordinate system;
- superimposing the bulb onto the x-y coordinate system, with the inner cavity of the bulb initially having a generally circular cross-section defining a boundary;
- measuring a radial distance that the predetermined radiation pattern extends past the light-emitting surface of the bulb at selected angles on the x-y coordinate system; and
- adding the measured radial distance at each selected angle to the generally circular cross-section of the inner cavity, extending the boundary of the inner cavity at each selected angle to plot the cross-sectional geometry for the inner cavity.

* * * * *